United States Patent [19]

Berland et al.

[11] Patent Number: 4,686,432
[45] Date of Patent: Aug. 11, 1987

[54] VERTICAL DEFLECTION CIRCUIT FOR ELECTRON BEAMS IN PICTURE TUBES

[75] Inventors: Pierre-Axel Berland, Villingen-Schwenningen; Jean-Claude Rufray, Brigachtal, both of Fed. Rep. of Germany

[73] Assignee: Deutsche Thomson-Brandt GmbH, Villingen-Schwenningen, Fed. Rep. of Germany

[21] Appl. No.: 794,078

[22] Filed: Nov. 1, 1985

[30] Foreign Application Priority Data

Nov. 2, 1984 [DE] Fed. Rep. of Germany ....... 3440024

[51] Int. Cl.$^4$ ......................... H01J 29/70; H01J 29/76
[52] U.S. Cl. ..................................... 315/403; 315/408; 328/183
[58] Field of Search ....................... 315/403, 408, 398; 328/183

[56] References Cited

U.S. PATENT DOCUMENTS 4,191,932  3/1980  Nagahama ......................... 328/183

Primary Examiner—Theodore M. Blum
Attorney, Agent, or Firm—Horst M. Kasper

[57] ABSTRACT

A voltage of a sawtooth generator is present at a capacitor. This voltage is compared to a reference voltage. In case of a deviation, a controllable current source is connected in parallel to a constant current source charging the capacitor. This allows the position of the picture to be maintained fixed by keeping the center of the picture at a preset level. A counter circuit counts lines of a screen picture and produces a control signal. An electronic switch is connected to the counter circuit and to the capacitor for periodically discharging the capacitor after a vertical deflection period triggered by the control signal of the counter circuit. A first comparator circuit is connected to the counter circuit and activated by a signal from the counter circuit and further connected to the capacitor for comparing the actual voltage applied at the capacitor to a reference voltage. A vertical deflection output stage has an input connected to the capacitor. The constant current source is connected to the capacitor for charging the capacitor with a charging current to provide a control signal for the vertical deflection output stage. The controllable current source is connected in parallel relative to the constant current source for controlling the charging current of the capacitor such that the voltage of the capacitor corresponding to the center of the picture screen is maintained at a constant value.

20 Claims, 2 Drawing Figures

VERTICAL DEFLECTION CIRCUIT FOR ELECTRON BEAMS IN PICTURE TUBES

BACKGROUND OF THE INVENTION

1. Field of the Invention

The present invention relates to a vertical deflection circuit for electron beams in pictures tubes of television receiver sets where a capacitor is charged by a constant current source for generating a control signal for a vertical deflection output stage, where the capacitor is periodically discharged after a vertical deflection period via an electronic switch and where a control signal for the electronic switch is derived from a counter circuit counting the lines of the television receiver picture.

2. Brief Description of the Background of the Invention Including Prior Art

A receiver circuit of the kind set forth above has been known from the integrated circuit TEA 2026 since about Mar. 1983. This circuit further comprises a first comparator circuit which is activated by the counter circuit and the comparator circuit compares the actual voltage at the capacitor with a reference voltage.

The saw-toothed voltage generated by an integrated circuit such as TEA 2026 includes a direct current component onto which the saw-tooth is superposed. A change of this direct current effects a vertical shifting of the picture. The amplitude of the saw-tooth voltage and thus the level of the picture can be changed in various ways. For example, the amplification of the current generator or the counter coupling of the output stage amplifier can be changed. The recited circuit, however, is associated with substantial disadvantages. For example, the picture size changes upon changing of the capacitor due to aging, temperature and the like. In addition, the level of the picture and the height of the picture are shifted during such changes of the capacitor. The setting of the amplitude and the adjusting of the position of the picture are not independent of each other. A change of the picture height, that is, of the amplitude of the deflection current, occurs in an unsymmetric way relative to the center of the picture. After an adjustment of the amplitude, there is therefore required a change of the position of the picture.

Summary of the Invention

1. Purposes of the Invention

It is an object of the present invention to provide a vertical deflection circuit where changes of the capacitor can be easily compensated.

It is another object of the present invention to provide a vertical deflection circuit for a picture tube where the deflection amplitude and thus the size of the picture can be maintained at constant value.

It is yet a further object of the present invention to provide a vertical deflection circuit where a second comparator circuit can be employed, which can be fed with a set point voltage in order to be able to shift the position of the picture.

These and other object and advantages of the present invention will become evident from the description which follows.

2. Brief Description of the Invention

The present invention provides a circuit for inducing a vertical deflection of electron beams in picture tubes which comprises the following: A capacitor is connected to an input of a vertical deflection output stage. A counter circuit for counting lines of a screen picture and producing a control signal is connected to the capacitor via an electronic switch for periodically discharging the capacitor after a vertical deflection period triggered by the control signal of the counter circuit. A first comparator circuit connected to the counter circuit and activated by a signal from the counter circuit is further connected to the capacitor for comparing the actual voltage applied at the capacitor to a reference voltage. A constant current source is connected to the capacitor for charging the capacitor with a charging current to provide a control signal for the vertical deflection output stage, and a controllable current source is connected in parallel relative to the constant current source for controlling the charging current of the capacitor such that the voltage of the capacitor corresponding to the center of the picture screen is maintained at a constant value.

A second comparator circuit can be connected to the capacitor and to the controllable current source for comparing the voltage at the capacitor to a second set point value. The second comparator can generate a control voltage for the controllable current source upon a deviation from the second set point value. The second comparator circuit can be actively connected to the counter circuit during a time corresponding to the center of the vertical sweep forward stroke of the picture.

The value of the set point voltage to be compared applied to the second comparator can correspond to the set point voltage applied at the first comparator circuit during the time of the vertical sweep forward stroke of the electron beam.

A second capacitor can be connected to an output of the second comparator to store the voltage value generated by the second comparator for the duration of a vertical deflection period.

The set point value fed to the second comparator circuit can be employed for shifting the position of the picture.

The reference voltage fed to the first comparator circuit can be employed for adjusting the amplitude of the deflection voltage.

A multiplier circuit can be connected to the reference voltage input of the first comparator circuit to adjust the reference voltage according to control signals such that the deflection amplitude and thus the size of the picture remain at a substantially constant value.

A vertical deflection coil can be connected to the output stage and supplied with a deflection current coming from the output stage.

A counter coupling voltage generator can be connected in series to the vertical deflection coil for providing a counter coupling voltage. The counter coupling voltage generator can be provided by a resistor. The electronic switch can be provided by a transistor.

Another aspect of the present invention provides a method for controlling an induced vertical deflection of electron beams in picture tubes. This method comprises the following:

A capacitor is charged from a constant current source and from a controllable current source connected in parallel to the constant current source to provide a control signal for a vertical deflection output stage.

Lines of a screen picture are counted in a counter circuit to produce a control signal in the counter circuit which depends on the counted lines of the screen picture.

An electronic switch connected to the counter circuit and to the capacitor is triggered by the control signal of the counter circuit after a vertical deflection period.

The capacitor is periodically discharged via the electronic switch upon a triggering of the electronic switch.

A first comparator circuit connected to the counter circuit is activated by a signal from the counter circuit.

The actual voltage applied at the capacitor is compared to a reference voltage in the first comparator circuit.

The voltage at the capacitor is fed to a vertical deflection output stage which has an input connected to the capacitor.

The charging current of the capacitor can be controlled such that the voltage of the capacitor corresponding to the center of the picture screen is maintained at a constant value.

The voltage at the capacitor can be compared to a second set point value in a second comparator circuit connected to the capacitor and to the controllable current source, and a control voltage can be generated for the controllable current source upon a deviation from the second set point value in the second comparator.

The voltage value generated by the second comparator can be stored for the duration of a vertical deflection period in a second capacitor connected to an output of the second comparator.

The invention is associated with the advantage that the position of the picture can be controlled automatically and that the amplitude changes occur symmetrically to the center of the picture. The amplitude adjustment and the shifting of the position of the picture can be performed without special setting elements and the circuit is particularly suitable to connection with a microprocessor control, where the required adjustments can be provided via a digital-analog converter.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

In the accompanying drawing, in which is shown one of the various possible embodiments of the present invention.

DESCRIPTION OF INVENTION AND PREFERRED EMBODIMENTS

Figure 1:
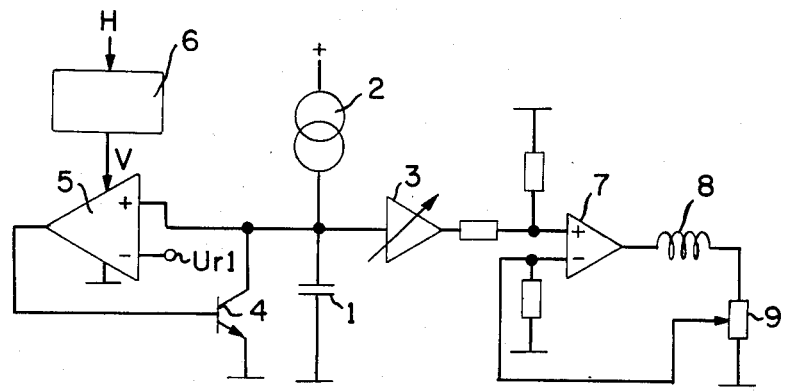
FIG. 1 is a schematic circuit diagram of a vertical deflection circuit according to the state of the art.

The present invention provides a circuit for inducing a vertical deflection of electron beams in picture tubes, which employs a capacitor which is charged by a constant current source for generation of a control signal for the vertical deflection output stage. The capacitor is periodically discharged after a vertical deflection period via an electronic switch, where the control signal for the electronic switch is derived from a counter circuit counting lines of a screen picture. The counter circuit activates a first comparator circuit for comparing the actual voltage at the capacitor with a reference voltage. A further controllable current source 10 is connected in parallel to the constant current source 2 and controls the charging current of the capacitor 1 such that the voltage of the capacitor corresponding to the picture center is maintained at a constant value.

A second comparator circuit 11 can be connected to the capacitor 1 and to the controllable current source 10 in order to compare the voltage at the capacitor to a second set point value Ur2 and to generate a control voltage for the controllable current source 10 upon a deviation from the second set point value.

A second capacitor 12 can be connected to an output of the second comparator 11 to store the voltage value generated by the second comparator 11 for the duration of a vertical deflection period.

A multiplier circuit 13 can be connected to the reference voltage input Ur1 of the first comparator circuit 5 to adjust the reference voltage Ur1 in response to control signals $U_A$, $U_B$ such that the deflection amplitude and thus the size of the picture remain at a substantially constant value.

A circuit is described initially in FIG. 1 as it is realized in the conventional integrated circuit TEA 2026.

A capacitor 1 is charged by a constant current source 2. A saw-tooth shape control voltage is generated at the capacitor 1 for an amplifier 3 which can be controlled as to the amplification factor. The discharge of the capacitor 1 occurring at the end of the vertical deflection is performed with the aid of an electronic switch 4. The electronic switch 4 is controlled by a comparator circuit 5. The comparator circuit 5 is switched to an active state with the aid of a counter circuit 6. The counter circuit 6 counts pulses H of line frequency and generates a control pulse V after a number of lines corresponding to a half picture. During this pulse, the capacitor 1 discharges to the reference voltage Ur1 present at one input of a comparator. Then the capacitor 1 is charged again. The voltage generated at the output of the amplifier stage 3 is fed to the input of an output stage 7 which supplies the deflection current required for the vertical deflection coil 8. A resistor 9 is connected in series to the deflection coil 8. A counter coupling voltage for the output stage 7 can be taken off from the resistor 9. In case of a change in the reference voltage Ur1, there occurs a change in the position of the picture, since the amplitude is maintained constant by the constant current source.

Figure 2:
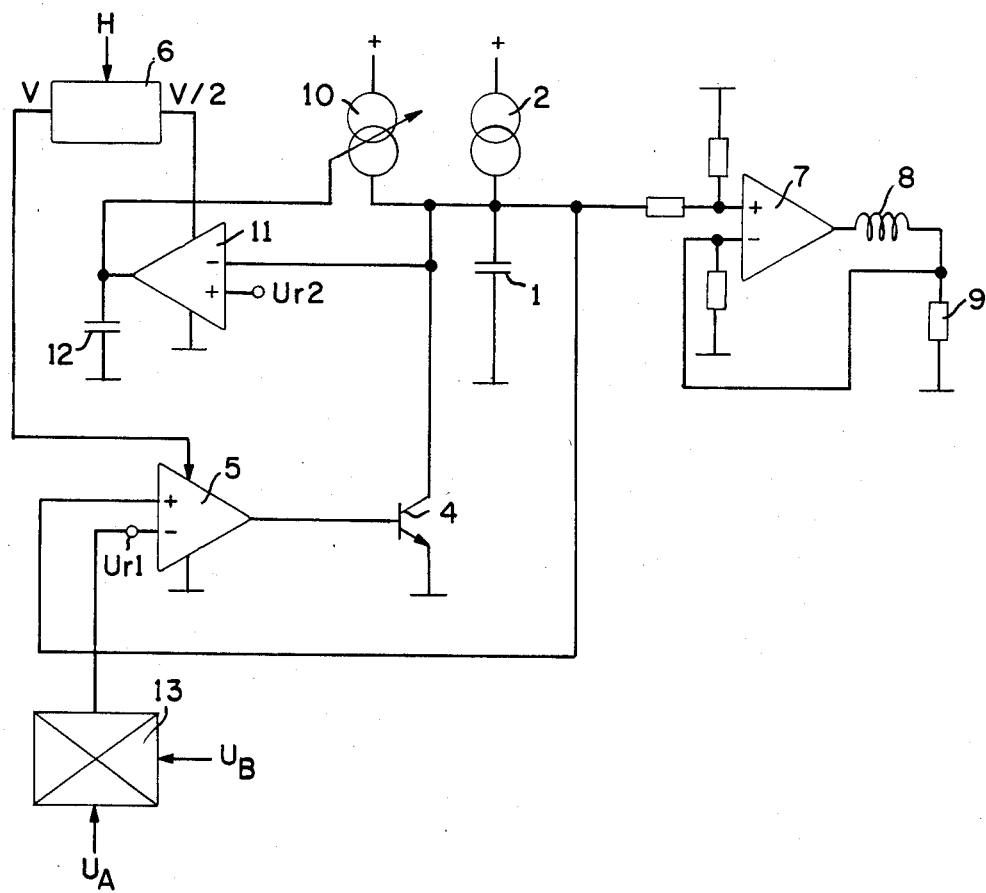
FIG. 2 is a schematic view of the vertical deflection circuit according to the present invention.

FIG. 2 shows the circuit according to the present invention. The elements corresponding to those illustrated in FIG. 1 are designated with the same reference numerals in FIG. 2.

A second control current source 10 is connected in parallel to the first constant current source 2. This current source can be controlled such that it adjusts the charging current for the capacitor 1 in such a way that the voltage at the capacitor is set to a fixed value with reference to a deflection point in time. This point in time refers to the center of the vertical deflection. For this purpose, the actual voltage at the capacitor 1 is compared with a fixed reference voltage Ur2 with the aid of a further second comparator circuit 11. This reference voltage corresponds to a voltage which has to be applied at the capacitor 1 in order to deflect the electron beam vertically up to the center. The comparison occurs during a line corresponding to the center of the picture. This is performed with the aid of a counter circuit 6 which activates the second comparator circuit 11 by a pulse V/2 after a corresponding number of lines. If the voltage at the capacitor 1 deviates from the predetermined set point for this given time interval, then a control pulse is generated at the output of the second comparator circuit 11. This value is maintained constant with the aid of the capacitor 12 for the time duration of a picture period.

The amplitude of the deflection can be changed by changing the reference voltage Url. For example, the amplitude is increased by decreasing the reference voltage applied at the comparator 5 such that the discharge of the capacitor 1 to a smaller voltage value occurs at a later point in time. The amplitude is symmetrically increased by the second control circuit which maintains the center voltage of the deflection at a constant value.

In case of variations of the operating voltage, for example for the vertical deflection, due to changes of the electron beam current, there is a change of the deflection amplitude and thus of the picture size. Therefore, a change in the reference voltage Url is required in order to maintain the size of the picture constant. For this purpose, a signal corresponding to the operating voltage $U_B$ as well as to the amplitude set value $U_A$ is fed to a multiplier circuit 13. The reference voltage Url is derived from these two values $U_B$ and $U_A$. If, for example, the value $U_B$ is decreased because of an increase in the beam current, then the multiplier circuit 13 also decreases automatically the reference voltage Url, which induces an increase in the deflection amplitude.

It will be understood that each of the elements described above, or two or more together, may also find a useful application in other types of deflection circuits differing from the types described above.

While the invention has been illustrated and described as embodied in the context of a vertical deflection circuit for electron beams in picture tubes, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. A circuit for inducing a vertical deflection of electron beams in picture tubes comprising
    a capacitor;
    a counter circuit for counting lines of a screen picture and producing a control signal;
    an electronic switch connected to the counter circuit and to the capacitor for periodically discharging the capacitor after a vertical deflection period triggered by the control signal of the counter circuit;
    a first comparator circuit connected to the counter circuit and activated by a signal from the counter circuit and further connected to the capacitor for comparing the actual voltage applied at the capacitor to a reference voltage;
    a vertical deflection output stage having an input connected to the capacitor;
    a constant current source connected to the capacitor for charging the capacitor with a charging current to provide a control signal for the vertical deflection output stage; and
    a controllable current source connected in parallel relative to the constant current source for controlling the charging current of the capacitor such that the voltage of the capacitor corresponding to the center of the picture screen is maintained at a constant value.

2. The circuit for inducing a vertical deflection of electron beams according to claim 1 further comprising a second comparator circuit connected to the capacitor and to the controllable current source, which second comparator compares the voltage at the capacitor to a second set point value and which second comparator generates a control voltage for the controllable current source upon a deviation from the second set point value.

3. The circuit for inducing a vertical deflection of electron beams according to claim 2 wherein the second comparator circuit is actively connected by the counter circuit during a time corresponding to the center of the vertical sweep forward stroke of the picture.

4. The circuit for inducing a vertical deflection of electron beams according to claim 2 wherein the value of the set point voltage to be compared applied to the second comparator corresponds to the set point voltage applied at the first comparator circuit during half of the time of the vertical sweep forward stroke of the electron beam.

5. The circuit for inducing a vertical deflection of electron beams according to claim 2 further comprising a second capacitor connected to an output of the second comparator, which second capacitor stores the voltage value generated by the second comparator for the duration of a vertical deflection period.

6. The circuit for inducing a vertical deflection of electron beams according to claim 2 where the set point value fed to the second comparator circuit is employed for shifting the position of the picture.

7. The circuit for inducing a vertical deflection of electron beams according to claim 1 where the reference voltage fed to the first comparator circuit is employed for adjusting the amplitude of the deflection voltage.

8. The circuit for inducing a vertical deflection of electron beams according to claim 1 further comprising a multiplier circuit connected to the reference voltage input of the first comparator circuit, which multiplier circuit adjusts the reference voltage based on control signals such that the deflection amplitude and thus the size of the picture remain at a substantially constant value.

9. The circuit for inducing a vertical deflection of electron beams according to claim 1 further comprising a vertical deflection coil connected to the output stage and supplied with a deflection current coming from the output stage.

10. The circuit for inducing a vertical deflection of electron beams according to claim 9 further comprising a counter coupling voltage generator connected in series to the vertical deflection coil for providing a counter coupling voltage.

11. The circuit for inducing a vertical deflection of electron beams according to claim 10 wherein the counter coupling voltage generator is provided by a resistor.

12. The circuit for inducing a vertical deflection of electron beams according to claim 1 wherein the electronic switch is provided by a transistor.

13. A circuit for inducing a vertical deflection of electron beams in picture tubes, which employs a capacitor which is charged by a constant current source for generation of a control signal for the vertical deflection output stage, where the capacitor is periodically discharged after a vertical deflection period via an electronic switch, where the control signal for the electronic switch is derived from a counter circuit counting lines of a screen picture, where the counter circuit activates a first comparator circuit for comparing the actual voltage at the capacitor with a reference voltage;

wherein a further controllable current source is connected in parallel to the constant current source, which controls the charging current of the capacitor such that the voltage of the capacitor corresponding to the picture center is maintained at a constant value.

14. The circuit for inducing a vertical deflection of electron beams according to claim 13 further comprising a second comparator circuit connected to the capacitor and to the controllable current source, which second comparator compares the voltage at the capacitor to a second set point value and which second comparator generates a control voltage for the controllable current source upon a deviation from the second set point value.

15. The circuit for inducing a vertical deflection of electron beams according to claim 14 further comprising a second capacitor connected to an output of the second comparator, which second capacitor stores the voltage value generated by the second comparator for half of the duration of a vertical deflection period.

16. The circuit for inducing a vertical deflection of electron beams according to claim 13 further comprising a multiplier circuit connected to the reference voltage input of the first comparator circuit, which multiplier circuit adjusts the reference voltage based on control signals such that the deflection amplitude and thus the size of the picture remain at a substantially constant value.

17. A method for controlling an induced vertical deflection of electron beams in picture tubes comprising charging a capacitor from a constant current source and from a controllable current source connected in parallel to the constant current source to provide a control signal for a vertical deflection output stage;

counting lines of a screen picture in a counter circuit; producing a control signal in the counter circuit depending on the counted lines of the screen picture;

triggering an electronic switch connected to the counter circuit and to the capacitor by the control signal of the counter circuit after a vertical deflection period;

periodically discharging the capacitor via the electronic switch upon a triggering of the electronic switch;

activating a first comparator circuit connected to the counter circuit by a signal from the counter circuit;

comparing the actual voltage applied at the capacitor to a reference voltage in the first comparator circuit; and feeding the voltage at the capacitor to a vertical deflection output stage having an input connected to the capacitor.

18. The method for controlling an induced vertical deflection of electron beams according to claim 17 further comprising controlling the charging current of the capacitor such that the voltage of the capacitor corresponding to the center of the picture screen is maintained at a constant value.

19. The method for controlling an induced vertical deflection of electron beams according to claim 17 further comprising comparing the voltage at the capacitor to a second set point value in a second comparator circuit connected to the capacitor and to the controllable current source; and generating a control voltage for the controllable current source upon a deviation from the second set point value in the second comparator.

20. The method for controlling an induced vertical deflection of electron beams according to claim 17 further comprising storing the voltage value generated by the second comparator for the duration of a vertical deflection period in a second capacitor connected to an output of the second comparator.

* * * * *